United States Patent
Chayat et al.

(10) Patent No.: US 9,435,638 B2
(45) Date of Patent: Sep. 6, 2016

(54) GIMBALED SCANNING MIRROR ARRAY

(71) Applicant: PRIMESENSE LTD., Tel Aviv (IL)

(72) Inventors: Naftali Chayat, Kfar Saba (IL); Yuval Gerson, Tel-Mond (IL)

(73) Assignee: APPLE INC., Cupertino, CA (US)

( * ) Notice: Subject to any disclaimer, the term of this patent is extended or adjusted under 35 U.S.C. 154(b) by 55 days.

(21) Appl. No.: 13/798,251

(22) Filed: Mar. 13, 2013

(65) Prior Publication Data

US 2014/0153001 A1 Jun. 5, 2014

Related U.S. Application Data

(60) Provisional application No. 61/614,018, filed on Mar. 22, 2012.

(51) Int. Cl.
| | |
|---|---|
| *G02B 26/08* | (2006.01) |
| *G02B 26/10* | (2006.01) |
| *G02B 26/12* | (2006.01) |
| *G01B 11/24* | (2006.01) |
| *G01S 17/89* | (2006.01) |
| *G01S 17/10* | (2006.01) |
| *G01S 17/42* | (2006.01) |

(Continued)

(52) U.S. Cl.
CPC ............ *G01B 11/24* (2013.01); *G01S 7/4817* (2013.01); *G01S 17/10* (2013.01); *G01S 17/42* (2013.01); *G01S 17/89* (2013.01); *G02B 26/085* (2013.01); *G02B 26/101* (2013.01); *G02B 26/105* (2013.01); *H01L 21/50* (2013.01)

(58) Field of Classification Search
USPC ......... 359/198.1–199.4, 200.6–200.8, 202.1, 359/221.2, 223.1–225.1, 226.2, 904, 359/290–295, 838, 846, 871, 872; 250/204, 250/559.06, 559.29, 230, 234; 347/255–260; 353/39, 98–99; 385/15–18, 22; 398/12, 19, 45
See application file for complete search history.

(56) References Cited

U.S. PATENT DOCUMENTS

| | | |
|---|---|---|
| 3,918,068 A | 11/1975 | Reinke et al. |
| 4,003,626 A | 1/1977 | Reinke et al. |

(Continued)

FOREIGN PATENT DOCUMENTS

| | | |
|---|---|---|
| CN | 101308343 A | 11/2008 |
| DE | 102011113147 B3 | 1/2013 |

(Continued)

OTHER PUBLICATIONS

Phase synchronization of micro-mirror arrays using elastic linkages Lung-Jieh Yang, Chih-Wei Liu, Peizen Chang Aug. 7, 2001 Sensors and Actuators A 95 (2001) 55-60.*

(Continued)

*Primary Examiner* — Ricky Mack
*Assistant Examiner* — Mustak Choudhury
(74) *Attorney, Agent, or Firm* — D.Kligler IP Services Ltd.

(57) ABSTRACT

An optical scanning device includes a substrate, which is etched to define an array of two or more parallel micromirrors and a support surrounding the micromirrors. Respective spindles connect the micromirrors to the support, thereby defining respective parallel axes of rotation of the micromirrors relative to the support. One or more flexible coupling members are connected to the micromirrors so as to synchronize an oscillation of the micromirrors about the respective axes.

17 Claims, 4 Drawing Sheets

(51) Int. Cl.
*G01S 7/481* (2006.01)
*H01L 21/50* (2006.01)

(56) References Cited

U.S. PATENT DOCUMENTS

| | | | |
|---|---|---|---|
| 5,629,790 | A | 5/1997 | Neukermans et al. |
| 5,742,419 | A | 4/1998 | Dickensheets et al. |
| 5,938,989 | A | 8/1999 | Hambright |
| 6,140,979 | A | 10/2000 | Gerhard et al. |
| 6,517,751 | B1 | 2/2003 | Hambright |
| 6,603,894 | B1 | 8/2003 | Pu |
| 6,825,967 | B1 | 11/2004 | Chong et al. |
| 6,882,770 | B2 | 4/2005 | Neilson et al. |
| 6,941,034 | B2 | 9/2005 | Kuboi |
| 7,609,875 | B2 | 10/2009 | Liu et al. |
| 7,952,781 | B2 | 5/2011 | Weiss et al. |
| 8,018,579 | B1 | 9/2011 | Krah |
| 8,437,063 | B2 | 5/2013 | Weiss et al. |
| 8,624,177 | B2 | 1/2014 | Campion et al. |
| 8,752,969 | B1 | 6/2014 | Kane et al. |
| 8,797,623 | B2 | 8/2014 | Weiss et al. |
| 2002/0070335 | A1 | 6/2002 | Orcrutt et al. |
| 2002/0071169 | A1* | 6/2002 | Bowers et al. ............... 359/291 |
| 2003/0162313 | A1 | 8/2003 | Kim et al. |
| 2004/0004775 | A1 | 1/2004 | Turner |
| 2004/0036936 | A1 | 2/2004 | Nakajima et al. |
| 2004/0040648 | A1 | 3/2004 | Harden et al. |
| 2004/0063235 | A1 | 4/2004 | Chang |
| 2004/0070816 | A1 | 4/2004 | Kato et al. |
| 2004/0105139 | A1 | 6/2004 | Hirose et al. |
| 2004/0207744 | A1 | 10/2004 | Bock |
| 2005/0157363 | A1 | 7/2005 | Orcutt |
| 2008/0143196 | A1 | 6/2008 | Sprague et al. |
| 2008/0225368 | A1 | 9/2008 | Ciabattoni et al. |
| 2009/0161177 | A1 | 6/2009 | Nomura |
| 2009/0284817 | A1 | 11/2009 | Orcutt |
| 2010/0046054 | A1 | 2/2010 | Jeong et al. |
| 2010/0142020 | A1* | 6/2010 | Kim ............................. 359/200.6 |
| 2010/0182667 | A1 | 7/2010 | Ishida |
| 2010/0302617 | A1 | 12/2010 | Zhou |
| 2011/0188054 | A1 | 8/2011 | Petronius et al. |
| 2011/0205456 | A1 | 8/2011 | Mizoguchi et al. |
| 2011/0205609 | A1 | 8/2011 | Mizoguchi |
| 2011/0228251 | A1 | 9/2011 | Yee et al. |
| 2011/0228367 | A1 | 9/2011 | Lubianiker et al. |
| 2011/0279648 | A1 | 11/2011 | Lutian et al. |
| 2011/0310125 | A1 | 12/2011 | Mceldowney et al. |
| 2012/0236379 | A1* | 9/2012 | da Silva et al. ........... 359/200.8 |
| 2012/0250124 | A1* | 10/2012 | Choi et al. ................. 359/198.1 |
| 2012/0307211 | A1 | 12/2012 | Hofmann et al. |
| 2013/0206967 | A1 | 8/2013 | Shpunt et al. |
| 2013/0207970 | A1 | 8/2013 | Shpunt et al. |
| 2013/0301101 | A1 | 11/2013 | Conrad et al. |
| 2014/0291491 | A1 | 10/2014 | Shpunt et al. |
| 2014/0291496 | A1 | 10/2014 | Shpunt et al. |
| 2014/0310914 | A1 | 10/2014 | Erlich et al. |
| 2014/0313519 | A1 | 10/2014 | Shpunt et al. |

FOREIGN PATENT DOCUMENTS

| | | |
|---|---|---|
| EP | 1411024 A2 | 4/2004 |
| EP | 1450198 A2 | 8/2004 |
| EP | 2333603 A1 | 6/2011 |
| EP | 2363686 A1 | 9/2011 |
| GB | 2271436 A | 4/1994 |
| JP | 2004191918 A | 7/2004 |
| KR | 100867147 B1 | 11/2008 |
| WO | 0247241 A1 | 6/2002 |
| WO | 03/049156 A2 | 6/2003 |
| WO | 2005078509 A2 | 8/2005 |
| WO | 2009107922 A1 | 9/2009 |
| WO | 2012/020380 A1 | 2/2012 |
| WO | 2012013536 A1 | 2/2012 |
| WO | 2014016794 A1 | 1/2014 |
| WO | 2014064606 A1 | 5/2014 |

OTHER PUBLICATIONS

International Application PCT/IB2013/051985 Search Report dated Jul. 22, 2013.
International Application PCT/IB2013/051189 Search Report dated Jun. 18, 2013.
Sromin et al., PCT Application PCT/IB2013/056101 filed on Jul. 25, 2013.
Judy et al., "Magnetic Microactuation of Polysilicon Flexure Structures," Solid-State Sensor and Actuator Workshop, year 1994.
Judy et al., "Magnetically Actuated, Addressable Microstructures," Journal of Microelectromechanical Systems, vol. 6, No. 3, pp. 249-256, Sep. 1997.
Cho et al., "A Scanning Micromirror Using a Bi-Directionally Movable Magnetic Microactuator," Proceedings of SPIE, MOEMS and Miniaturized Systems, vol. 4178, pp. 106-115, USA 2000.
Hamamatsu Photonics K.K., "Position sensitive detectors", Japan, Feb. 2010.
Gale, M.T., "Replication Technology for Diffractive Optical Elements", Proceedings of SPIE, vol. 3010, pp. 111-123, May 15, 1997.
Kolste et al., "Injection Molding for Diffractive Optics", Proceedings of SPIE, vol. 2404, pp. 129-131, Feb. 9, 1995.
Gale et al., "Replicated Microstructures for Integrated Topics", Proceedings of SPIE, vol. 2513, pp. 2-10, Aug. 29, 1994.
Jahns et al., "Diffractive Optics and Micro-Optics: Introduction to the Feature Issue", Applied Optics Journal, vol. 36, No. 20, pp. 4633-4634, Jul. 10, 1997.
Nikolejeff et al., "Replication of Continuous Relief Diffractive Optical Elements by Conventional Compact Disc Injection-Molding Techniques", Applied Optics Journal, vol. 36, No. 20, pp. 4655-4659, Jul. 10, 1997.
Neyer et al., "New Fabrication Technology for Polymer Optical Waveguides", Integrated Photonics Research, pp. 248-249, year 1992.
Neyer et al., "Fabrication of Low Loss Polymer Waveguides Using Injection Moulding Technology", Electronics Letters, vol. 29, No. 4, pp. 399-401, Feb. 18, 1993.
Optical Society of America, "Diffractive Optics and Micro-Optics", 1996 Technical Digest Series, vol. 5, Boston, USA, Apr. 29-May 2, 1996.
Lintec Corporation, "Adwill D-510T Tape", Japan, Apr. 4, 2006.
EP Patent Application # 05804455.3 Official Action dated Feb. 15, 2010.
International Application PCT/IL2005/001194 Search Report dated Jun. 6, 2006.
U.S. Appl. No. 11/667,709 Official Action dated Apr. 30, 2010.
Stark, B., "MEMS Reliability Assurance Guidelines for Space Applications", Jet Propulsion Laboratory, California Insitute of Technology, Pasadena, USA, Jan. 1999.
U.S. Appl. No. 13/100,312 Official Action dated Oct. 31, 2011.
Mor et al., U.S. Appl. No. 12/723,644, filed Mar. 14, 2010.
U.S. Appl. No. 12/723,644 Official Action dated Jan. 19, 2012.
U.S. Appl. No. 12/723,644 Official Action dated Sep. 13, 2012.
Sromin et al., U.S. Appl. No. 61/675,828, filed Jul. 26, 2012.
Sromin et al., U.S. Appl. No. 61/835,655, filed Jun. 17, 2013.
Shpunt et al., U.S. Appl. No. 13/766,801, filed Feb. 14, 2013.
Weiss et al., U.S. Appl. No. 13/856,444, filed Apr. 4, 2013.
Erlich et al., U.S. Appl. No. 61/781,086, filed Mar. 14, 2013.
Erlich et al., U.S. Appl. No. 61/717,427, filed Oct. 23, 2012.
Fujita et al., "Dual-Axis MEMS Mirror for Large Deflection-Angle Using SU-8 Soft Torsion Beam," Sensors and Actuators A: Physical, vol. 121, issue 1, pp. 16-21, May 2005.
Shpunt et al., U.S. Appl. No. 61/786,711, filed Mar. 15, 2013.
Stone et al., "Performance Analysis of Next-Generation LADAR for Manufacturing, Construction, and Mobility", National Institute of Standards and Technology, document # NISTIR 7117, Gaithersburg, USA, May 2004.
European Patent Application # 12155674.0 Search Report dated May 3, 2013.
Shpunt et al., U.S. Appl. No. 61/835,653, filed Jun. 17, 2013.
Shpunt et al., U.S. Appl. No. 61/835,657, filed Jun. 17, 2013.
Shpunt et al., U.S. Appl. No. 13/766,811, filed Feb. 14, 2013.
U.S. Appl. No. 13/856,444 Office Action dated Nov. 12, 2013.

(56) References Cited

OTHER PUBLICATIONS

Yang et al., "Phase synchronization of micro-mirror arrays using elastic linkages", Sensors and Actuators A, Elsevier Sequoia, vol. 95, No. 1, pp. 55-60, Dec. 15, 2001.
European Application # 13764401.9 Search Report dated Mar. 6, 2015.
Fraunhofer Institute for Photonic Microsystems, "Lamda—Large Aperture MEMS Scanner Module for 3D Distance Measurement"—Data sheet, Dresden, Germany, 2 pages, May 9, 2012.
International Application # PCT/IB2013/056101 Search Report Dated Dec. 17, 2013.
Shpunt, A., U.S. Appl. No. 14/551,113, filed Nov. 24, 2014.
Gerson et al., U.S. Appl. No. 14/599,507, filed Nov. 18, 2014.
Shpunt et al., U.S. Appl. No. 14/551,104, filed Nov. 24, 2014.
Shpunt et al., U.S. Appl. No. 14/554,078, filed Nov. 26, 2014.
Niclass et al., "Design and characterization of a 256×64-pixel single-photon imager in CMOS for a MEMS based laser scanning time-of-flight sensor", Optics Express, vol. 20, No. 11, pp. 11863-11881, May 21, 2012.
Hah et al., "Theory and Experiments of Angular Vertical Comb-Drive Actuators for Scanning Micromirrors", IEEE Journal of Selected Topics in Quantum Electronics, vol. 10, No. 3, pp. 505-513, May/Jun. 2004.
Sandenr et al., "Large Aperture MEMS Segmented Scanner Module for LIDAR Systems", SPAR Conference—Europe, Amsterdam, 48 pages, Dec. 8, 2010.
Shpunt et al., U.S. Appl. No. 14/554,086, filed Nov. 26, 2014.
Minifaros, "D1.1-ProjectPresentation", V3.0, 36 pages, Dec. 22, 2010.
International Application # PCT/US15/11883 Search Report dated Jul. 21, 2015.
International Application # PCT/US15/56297 Search Report dated Jan. 19, 2016.
Sandner et al., "3D imaging using resonant large-aperture MEMS mirror arrays and laser distance measurement", IEEE/LEOS International Conference on Optical MEMs and Nanophotonics, pp. 78-79, Aug. 11, 2008.
CN Application # 201380015506.3 Office Action dated Mar. 31, 2016.
Gruger et al., "New approach for MEMS scanning mirror for laser projection systems", SPIE Proceedings, vol. 3887, MOEMs and Miniaturized Systems VII, pp. 68870L-68870L, Feb. 8, 2008.
International Application No. PCT/US2015/67974 Search Report dated May 3, 2016.

\* cited by examiner

GIMBALED SCANNING MIRROR ARRAY

CROSS-REFERENCE TO RELATED APPLICATION

This patent application claims the benefit of U.S. Provisional Patent Application 61/614,018, filed Mar. 22, 2012, which is incorporated herein by reference.

FIELD OF THE INVENTION

The present invention relates generally to optical scanning.

BACKGROUND

Various methods are known in the art for optical 3D mapping, i.e., generating a 3D profile of the surface of an object by processing an optical image of the object. This sort of 3D profile is also referred to as a 3D map, depth map or depth image, and 3D mapping is also referred to as depth mapping.

PCT International Publication WO 2012/020380, whose disclosure is incorporated herein by reference, describes apparatus for mapping, which includes an illumination module. This module includes a radiation source, which is configured to emit a beam of radiation, and a scanner, which is configured to receive and scan the beam over a selected angular range. Illumination optics are configured to project the scanned beam so as to create a pattern of spots extending over a region of interest. An imaging module is configured to capture an image of the pattern that is projected onto an object in the region of interest. A processor is configured to process the image in order to construct a three-dimensional (3D) map of the object.

U.S. Patent Application Publication 2011/0279648, whose disclosure is incorporated herein by reference, describes a method for constructing a 3D representation of a subject, which comprises capturing, with a camera, a 2D image of the subject. The method further comprises scanning a modulated illumination beam over the subject to illuminate, one at a time, a plurality of target regions of the subject, and measuring a modulation aspect of light from the illumination beam reflected from each of the target regions. A moving-mirror beam scanner is used to scan the illumination beam, and a photodetector is used to measure the modulation aspect. The method further comprises computing a depth aspect based on the modulation aspect measured for each of the target regions, and associating the depth aspect with a corresponding pixel of the 2D image.

U.S. Pat. No. 8,018,579, whose disclosure is incorporated herein by reference, describes a three-dimensional imaging and display system in which user input is optically detected in an imaging volume by measuring the path length of an amplitude modulated scanning beam as a function of the phase shift thereof. Visual image user feedback concerning the detected user input is presented.

U.S. Pat. No. 7,952,781, whose disclosure is incorporated herein by reference, describes a method of scanning a light beam and a method of manufacturing a microelectromechanical system (MEMS), which can be incorporated in a scanning device.

SUMMARY

Embodiments of the present invention that are described hereinbelow provide improved scanning devices, as well as apparatus and methods for 3D mapping using such devices.

There is therefore provided, in accordance with an embodiment of the invention, an optical scanning device, including a substrate, which is etched to define an array of two or more parallel micromirrors and a support surrounding the micromirrors. Respective spindles connect the micromirrors to the support, thereby defining respective parallel axes of rotation of the micromirrors relative to the support. One or more flexible coupling members are connected to the micromirrors so as to synchronize an oscillation of the micromirrors about the respective axes.

In a disclosed embodiment, the substrate is etched to separate the support from the substrate surrounding the support, and to define further spindles connecting the support to the substrate, thereby providing a further axis of rotation of the support, which is perpendicular to the axes of rotation of the micromirrors.

In one embodiment, the one or more flexible coupling members include a belt, which is etched from the substrate and has first and second ends attached respectively to first and second ones of the micromirrors and is anchored to the support at a point between the first and second ends. The belt may be thinned relative to the substrate.

The one or more flexible coupling members may be coupled so as to cause the micromirrors to oscillate in phase, so that the micromirrors have the same angular orientation during oscillation, or alternatively so as to cause the micromirrors to oscillate in anti-phase.

Typically the device includes a reflective coating applied to the substrate on the micromirrors, wherein the substrate is a part of a silicon wafer. In a disclosed embodiment, the device includes an electromagnetic drive, which is coupled to drive the micromirrors to oscillate about the respective parallel axes.

There is also provided, in accordance with an embodiment of the invention, scanning apparatus, including a substrate, which is etched to define an array of two or more parallel micromirrors and a support surrounding the micromirrors, wherein the micromirrors are coupled to rotate in mutual synchronization about respective parallel first axes of rotation relative to the support while the support rotates about a second axis relative to the substrate. An electromagnetic drive is coupled to cause the micromirrors and the support to rotate respectively about the first and second axes.

In some embodiments, the electromagnetic drive includes a stator assembly, including at least one magnetic core having an air gap and at least one coil wound on the magnetic core, and at least one rotor, on which the support is mounted and which is suspended in the air gap so as to move within the air gap in response to a current driven through the at least one coil. In a disclosed embodiment, the support has a pair of wings, each connected to the substrate by a respective spindle, and the at least one rotor includes a pair of permanent magnets, each connected to a respective one of the wings. Additionally or alternatively, the electromagnetic drive and the current may be configured to cause the micromirrors to rotate about the first axes at a first frequency, which is a resonant frequency of rotation, while causing the support to rotate about the second axis at a second frequency, which is lower than the first frequency.

In a disclosed embodiment, the substrate is etched to define respective first spindles connecting the micromirrors to the support, thereby defining the respective parallel first axes of rotation of the micromirrors relative to the support, one or more flexible coupling members, which are connected to the micromirrors so as to synchronize an oscillation of the micromirrors about the respective first axes, and second spindles connecting the support to the substrate along the second axis.

In one embodiment, the apparatus includes a transmitter, which is configured to emit a beam including pulses of light toward the micromirror array while the micromirrors and the support rotate, so as to cause the micromirrors to scan the beam over a scene, a receiver, which is configured to receive, by reflection from the micromirror array, the light reflected from the scene and to generate an output indicative of a time of flight of the pulses to and from points in the scene, and a controller, which is coupled to process the output of the receiver during a scan of the beam so as to generate a three-dimensional map of the scene.

There is additionally provided, in accordance with an embodiment of the invention, a method for producing an optical scanning device. The method includes etching a substrate so as to define an array of two or more parallel micromirrors, a support surrounding the micromirrors, respective spindles connecting the micromirrors to the support, thereby defining respective parallel axes of rotation of the micromirrors relative to the support, and one or more flexible coupling members, which are connected to the micromirrors so as to synchronize an oscillation of the micromirrors about the respective axes.

There is further provided, in accordance with an embodiment of the invention, a method for scanning, which includes providing a substrate, which is etched to define an array of two or more parallel micromirrors and a support surrounding the micromirrors. The micromirrors are driven to rotate in mutual synchronization about respective parallel first axes of rotation relative to the support while driving the support to rotate about a second axis relative to the substrate. A beam of light is directed toward the micromirror array while the micromirrors and the support rotate, so as to cause the micromirrors to scan the beam over a scene.

The present invention will be more fully understood from the following detailed description of the embodiments thereof, taken together with the drawings in which:

DETAILED DESCRIPTION OF EMBODIMENTS

U.S. patent application Ser. No. 13/766,801, filed Feb. 14, 2013, which is assigned to the assignee of the present patent application and whose disclosure is incorporated herein by reference, describes depth engines that generate 3D mapping data by measuring the time of flight of a scanning beam. A light transmitter, such as a laser, directs short pulses of light toward a scanning mirror, which scans the light beam over a scene of interest. A receiver, such as a sensitive, high-speed photodiode (for example, an avalanche photodiode) receives light returned from the scene via the same scanning mirror. Processing circuitry measures the time delay between the transmitted and received light pulses at each point in the scan. This delay is indicative of the distance traveled by the light beam, and hence of the depth of the object at the point. The processing circuitry uses the depth data thus extracted in producing a 3D map of the scene.

For compactness, low cost, and low power consumption, the scanning mirror in this sort of scanning system may be produced using MEMS technology (possibly by means of the sorts of techniques that are described in the above-mentioned U.S. Pat. No. 7,952,781). To enhance the sensitivity of the system, it is advantageous that the mirror be as large as possible (typically with an active area in the range of 5-25 mm$^2$). At the same time, for 3D mapping, as well as other scanning applications, it is desirable that the mirror scan mechanically about at least one axis over large angles (typically ±10-25°) at high frequency (typically 2-10 kHz). (The scan range about the second scan axis may be even larger, but the scan frequency is typically lower.) The need for high scan frequency and range conflicts with the desire to increase mirror size, and it may be infeasible to make a single scanning mirror of the desired size, range, and frequency capabilities given the limitations of the material (such as a silicon wafer) from which the scanner is made.

Embodiments of the present invention that are described herein seek to overcome these design constraints by using an array of multiple, adjacent mirrors. The mirrors scan in mutual synchronization, and thus behave optically as though they were a single mirror, of dimensions equal to the size of the entire array. A weak mechanical link between the mirrors in the array is used to couple the oscillations of the mirrors and thus maintain the synchronization between them.

In the embodiments that are illustrated in the figures, the synchronized mirror array comprises two micromirrors, which operate in phase and are mounted on a gimbaled base for two-axis scanning. (The term "micromirror" is used herein simply to refer to very small mirrors, which are typically no more than a few millimeters across, although it may be possible to apply the principles of the present invention to larger mirrors.) Alternatively, such mirror arrays may comprise a larger number of mirrors, and may be deployed with or without gimbaling. Further alternatively or additionally, other forms of synchronization, such as anti-phased rotation of the mirrors in the array, can be implemented by appropriate design of the mirrors and the mechanical link between them.

Figure 1:
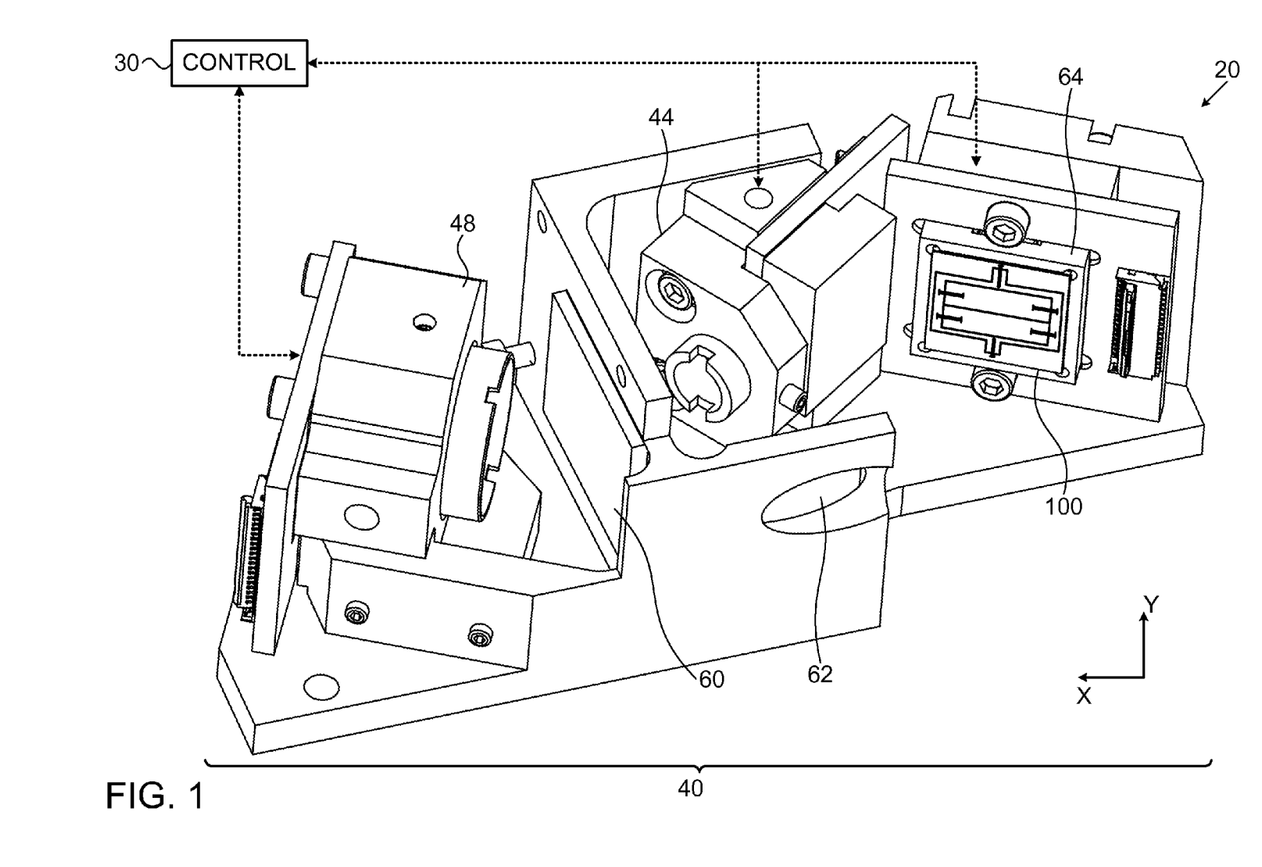
FIG. 1 is a schematic, pictorial illustration of an optical scanning head, in accordance with an embodiment of the present invention.

FIG. 1 schematically illustrates elements of an optical scanning head 40 comprising a gimbaled micromirror array 100, in accordance with an embodiment of the present invention. With the exception of the micromirror array itself, optical scanning head 40 is similar to the optical scanning head that is described in the above-mentioned U.S. patent application Ser. No. 13/766,801. A transmitter 44 emits pulses of light toward a polarizing beamsplitter 60. Typically, only a small area of the beamsplitter, directly in the light path of transmitter 44, is coated for reflection, while the remainder of the beamsplitter is fully transparent in the transmitted wavelength range (or even anti-reflection coated for it) to permit returned light to pass through to a receiver 48. The light from transmitter 44 reflects off beamsplitter 60 and then a folding mirror 62 toward micromirror array 100. A MEMS scanner 64 scans the micromirror array in X- and Y-directions with the desired scan frequency and amplitude. Details of the micromirror array and scanner are shown in the figures that follow.

Light pulses returned from the scene strike micromirror array 100, which reflects the light via folding mirror 62 through beamsplitter 60. To limit the amount of unwanted ambient light that reaches receiver 48, a bandpass filter (not shown) may be incorporated in the receiver path, possibly on the same substrate as beamsplitter 60. Receiver 48 senses the returned light pulses and generates corresponding electrical pulses. A controller 30 drives transmitter 44 and scanner 64 and analyzes the time delay between the transmitted pulses and the corresponding pulses from receiver 48 in order to measure the time of flight of each pulse. Based on this time of flight, the controller computes the depth coordinate of each point in the scene that is scanned by scanning head 40 and thus generates a depth map of the scene.

To enhance sensitivity of detection, the overall area of beamsplitter 60 and the aperture of receiver 48 are considerably larger than the area of the transmitted beam. It is also desirable that the micromirrors in micromirror array 100 be as large as possible, within the inertial constraints imposed by the scanner. For example, the area of each micromirror may be about 12.5 mm$^2$, and the overall area of the micromirror array may be about 25 mm$^2$.

The specific mechanical and optical designs of the optical head shown in FIG. 1 are described here by way of example, and alternative designs implementing similar principles are considered to be within the scope of the present invention.

Figure 2:
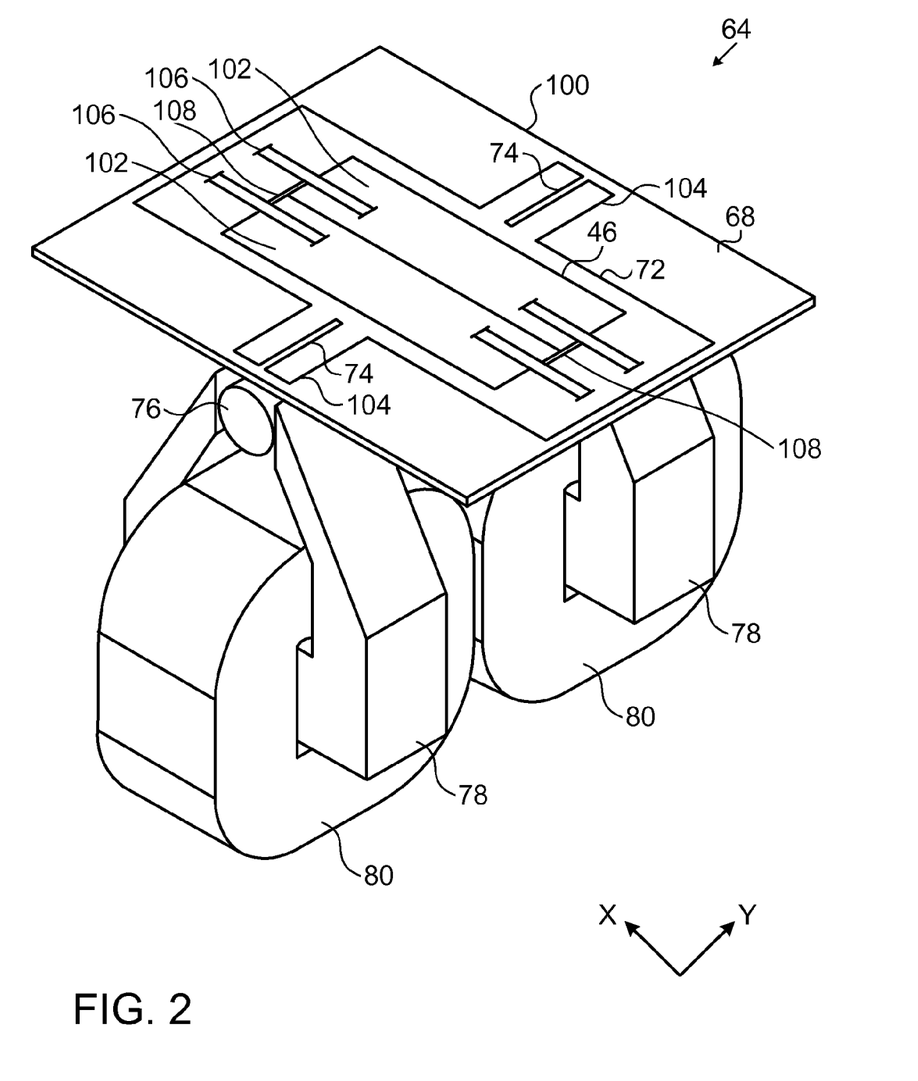
FIG. 2 is a schematic, pictorial illustration of a MEMS scanner, in accordance with an embodiment of the present invention.

FIG. 2 is a schematic, pictorial illustration of MEMS scanner 64, in accordance with an embodiment of the present invention. This scanner is produced and operates on principles similar to those described in the above-mentioned U.S. Pat. No. 7,952,781, but enables two-dimensional scanning of micromirror array 100. The micromirror array is produced by suitably etching a semiconductor substrate 68 to separate micromirrors 102 in the array from a support 72 (also referred to as a gimbal), and to separate the support from the remaining substrate 68. After etching, micromirrors 102 (to which a suitable reflective coating is applied) are able to rotate in the Y-direction relative to support 72 on spindles 106, while support 72 rotates in the X-direction relative to substrate 68 on spindles 74, which are coupled to wings 104 of support 72.

Micromirrors 102 and support 72 are mounted on a pair of rotors 76, which typically comprise permanent magnets. (Only one of the rotors is visible in this figure.) Rotors 76 are suspended in respective air gaps of magnetic cores 78. Cores 78 are wound with respective coils 80 of conductive wire, thus creating an electromagnetic stator assembly. Although a single coil per core is shown in FIG. 2 for the sake of simplicity, two or more coils may alternatively be wound on each core; coils may be wound at different places on the cores; and different core shapes may also be used. Alternative core and coil designs are shown, for example, in U.S. Provisional Patent Application 61/675,828, filed Jul. 26, 2012, which is incorporated herein by reference.

Driving an electrical current through coils 80 generates a magnetic field in the air gaps, which interacts with the magnetization of rotors 76 so as to cause the rotors to rotate or otherwise move within the air gaps. Specifically, coils 80 are driven with high-frequency differential currents so as to cause micromirror 46 to rotate resonantly back and forth about spindles 70 at high frequency (typically in the range of 2-10 kHz, as noted above). This resonant rotation generates the high-speed Y-direction raster scan of the output beam from engine 22. At the same time, coils 80 are driven together at lower frequency to drive the X-direction scan by rotation of support 72 about spindles 74 through the desired scan range. Alternatively, other stator configurations and drive schemes may be used for these purposes, as described in the above-mentioned U.S. Provisional Patent Application 61/675,828, for example. The X- and Y-rotations together generate the overall raster scan pattern of micromirror 46.

Assembly of optical head 40 from discrete optical and mechanical components, as shown in FIG. 1, requires precise alignment and can be costly. In alternative embodiments, all parts requiring precise placement and alignment (such as the light transmitter, receiver, and associated optics) may be combined in a single integrated package on a silicon optical bench (SiOB). This approach can save costs and may make the depth engine easier to handle. Various alternative designs of these sorts are shown in the above-mentioned U.S. patent application Ser. No. 13/766,801, and may be adapted, as well, for use with a micromirror array.

Figure 3:
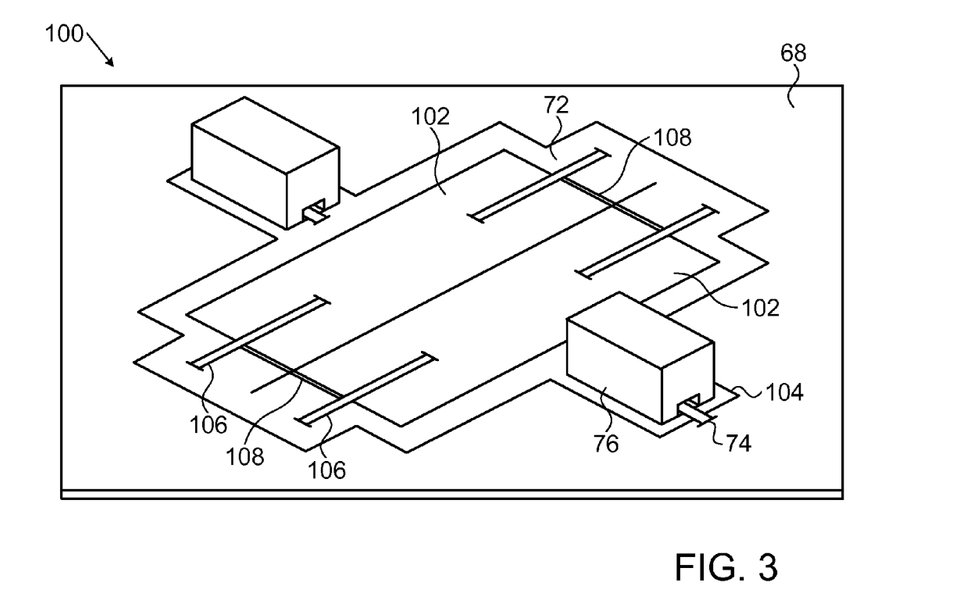
FIG. 3 is a schematic rear view of a gimbaled micromirror array, in accordance with an embodiment of the invention.

FIG. 3 is a schematic rear view of gimbaled micromirror array 100, in accordance with an embodiment of the invention. Array 100 as pictured in FIG. 3 differs in some details of shape and orientation from the micromirror array that is show in FIGS. 1 and 2, but its elements and principles of operation are the same. As noted earlier, array 100 comprises two parallel micromirrors 102, which are connected to support 72 by respective spindles 106. Magnetic rotors 76 are attached to wings 104 of support 72, which are coupled to substrate 68 by spindles 74, perpendicular to spindles 106. In operation, rotors 76 are suspended within the air gaps of cores 78, as shown in FIG. 2 and explained above. Mirrors 102 are linked mechanically to one another by flexible coupling members in the form of belts 108, as explained below.

Figure 4:
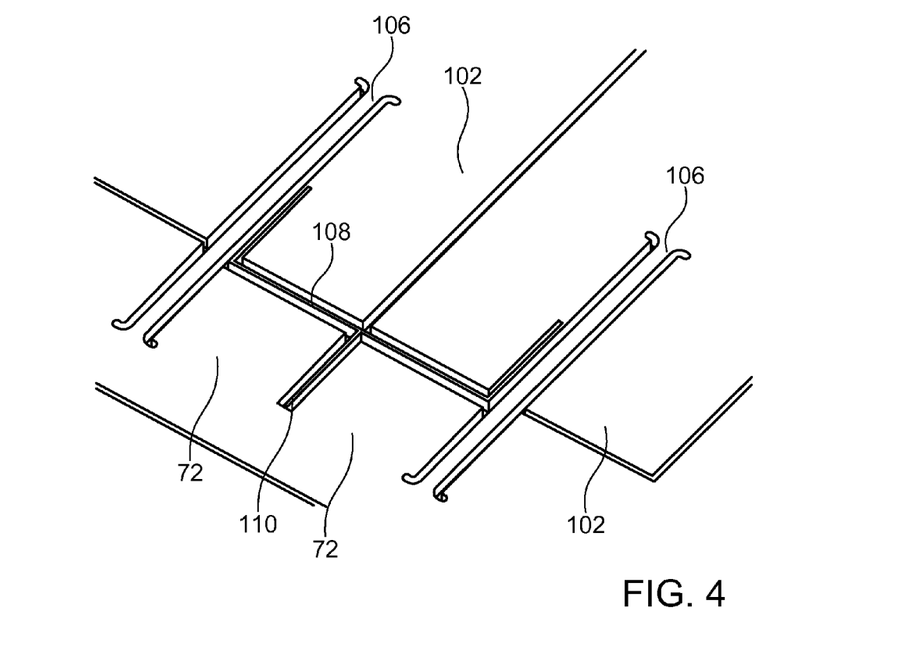
FIG. 4 is a schematic detail view showing elements of the micromirror array of FIG. 3.
Figure 5:
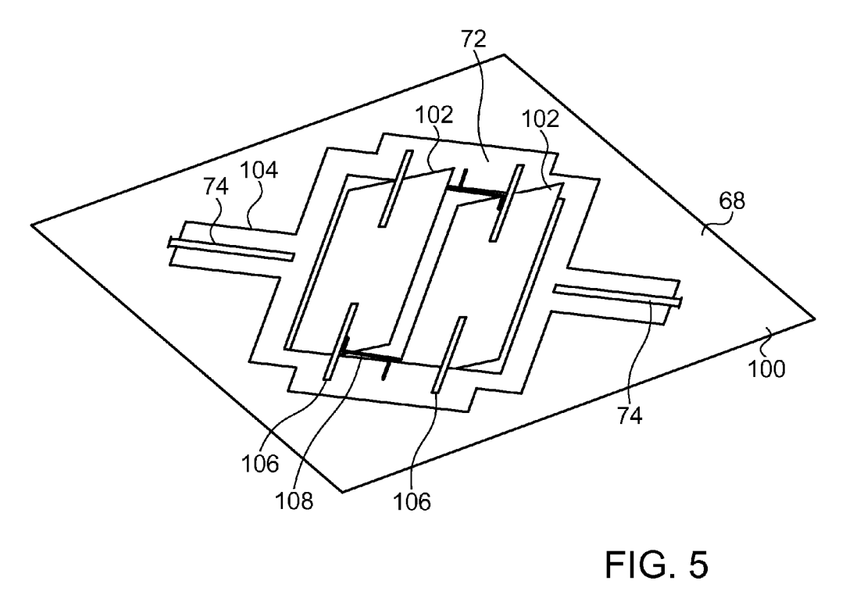
FIG. 5 is a schematic front view of the micromirror array of FIG. 3 in operation.

FIG. 4 is an enlarged, detail view of micromirrors 102, showing details of one of belts 108. This belt is produced in the same photolithographic process in which the mirrors and their spindles are etched apart from substrate 68. Belt 108 thus comprises a thin strip of silicon, typically about 10-100 μm wide, which is separated by grooves etched through the substrate from support 72 on one side and from micromirrors 102 on the other. The thickness of the belt (i.e., the dimension perpendicular to the wafer surface) may be the full thickness of the wafer. Alternatively, belt 108 may be thinned to alter the belt connection stiffness and to enable bending and stretching modes of the belt in addition to the torsion mode that is illustrated in FIG. 5. Each end of the belt is connected to a respective one of the micromirrors, and the belt is anchored to support 72 at a central pivot point 110.

FIG. 5 is a schematic pictorial view of array 100 in operation, powered by a MEMS scanner as shown above. The MEMS scanner drives both micromirrors 102 to rotate simultaneously about the X-axis (as defined in FIG. 2). The elastic force exerted by belts 108 couples the motion of the two micromirrors together, so that they rotate in perfect phase synchronization and have the same angular orientation during oscillation. Even if the actual force exerted by the belts is small, it is sufficient to maintain mechanical phase locking and thus synchronize the two adjacent oscillators (i.e., the micromirrors), which have approximately the same resonant frequency. Thus, array 100 behaves optically as though it were a single oscillating mirror, with dimensions equal to the combined dimensions of both micromirrors 102 together.

Physically speaking, spindles 106 act as torsion springs, and belt 108 adds a third spring to the system, coupling together the masses of micromirrors 102. When the masses are coupled via this third spring, two modes of motion are possible: one in which, the masses move in the same direction, and the other in which the masses move in opposite directions. (Each mode has its own frequency, which is shared by both mirrors, as opposed to the individual frequencies of the two mirrors in the absence of a coupling member.) The stiffness of the third spring can be adjusted, even to the point at which belt 108 is the primary spring, exerting greater force than pivots 106.

Figure 6:
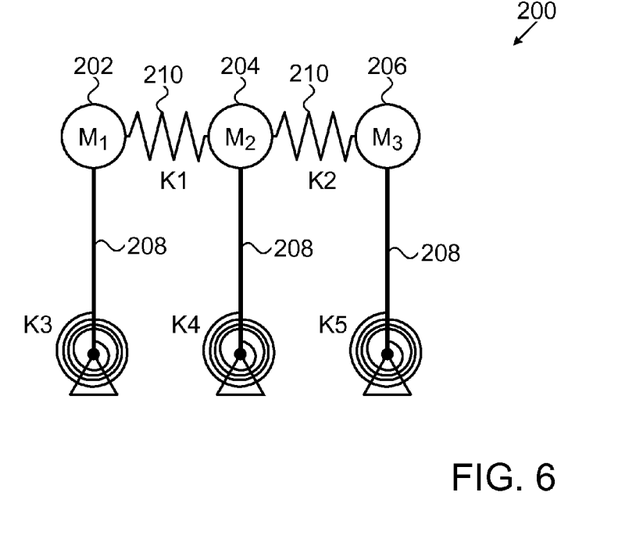
FIG. 6 is a schematic diagram illustrating principles of operation of a gimbaled micromirror array, in accordance with an embodiment of the present invention.

FIG. 6 is a schematic diagram illustrating principles of operation of a gimbaled micromirror array 200, in accordance with an embodiment of the present invention. This figure illustrates how the principles described above may be extended to arrays of three micromirrors 202, 204, 206 (labeled M1, M2 and M3), or more. Mirrors M1, M2 and M3 are mounted on pivots 208 (such as the sort of spindles described above), represented as springs K3, K4, K5, while the mirrors are linked by belts 210 represented as springs K1 and K2. This arrangement can be used to synchronize the rotation of the three mirrors in the same manner as in the two-mirror embodiments described above. The three (or more) mirrors may likewise be mounted together on a gimbaled support. Regardless of whether the array includes two, three, or more mirrors, the springs may be implemented either as the sort of pivots and belts that are shown in the preceding figures or using other sorts of flexible, elastic elements, which may be fabricated by any suitable technique that is known in the art.

Although the operation of micromirror array 100 is described above primarily in the context of optical head and 3D mapping, the principles of array 100 may similarly be applied in optical scanners of other types, for substantially any application requiring a compact, high-frequency resonant scanner. Such scanners may be driven magnetically, as in the embodiments described above, or using any other suitable sort of drive mechanism that is known in the art, including various types of magnetic and electrostatic drives, for example. Furthermore, as noted earlier, the mirrors may be coupled and driven so that while rotating at the same frequency, the mirrors are oriented at different angles during their respective scans. This latter mode of operation can be useful in synchronized multi-beam scanning systems.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical scanning device, comprising a substrate, which is etched to define:
   an array of two or more parallel micromirrors, comprising at least first and second micromirrors;
   a gimbal, closely surrounding the entire array of micromirrors;
   respective first spindles connecting the micromirrors to the support, thereby defining respective first parallel axes of rotation of the micromirrors relative to the gimbal, and second spindles connecting the gimbal to the substrate and defining a second axis of rotation, perpendicular to the first axes, such that the second spindles are parallel to the second axis; and
   one or more flexible belts, which comprise thin strips separated by grooves etched through the substrate from the gimbal on one side of the strips and from the micromirrors on the other side of the strips, and which have a first end attached to a first edge of the first micromirror and a second end attached to a second edge of the second micromirror and are anchored to the gimbal at a point between the first and second ends so as to mechanically synchronize an angular orientation of oscillation of the micromirrors about the respective first axes, while the gimbal rotates about the second axis relative to the substrate in order to maintain phase locking.

2. The device according to claim 1, wherein the belt is thinned relative to the substrate.

3. The device according to claim 1, wherein the one or more flexible coupling members are coupled so as to cause the micromirrors to oscillate in phase, so that the micromirrors have the same angular orientation during oscillation.

4. The device according to claim 1, wherein the one or more flexible coupling members are coupled so as to cause the micromirrors to oscillate in anti-phase.

5. The device according to claim 1, andcomprising a reflective coating applied to the substrate on the micromirrors.

6. The device according to claim 1, wherein the substrate is a part of a silicon wafer.

7. The device according to claim 1, andcomprising an electromagnetic drive, which is coupled to drive the micromirrors to oscillate about the respective parallel axes.

8. Scanning apparatus, comprising:
   a substrate, which is etched to define an array of two or more parallel micromirrors and a support closely surrounding the array, wherein the micromirrors are coupled to rotate on respective first spindles in mutual synchronization of angular orientation about respective parallel first axes of rotation relative to the support while the support rotates about a second axis relative to the substrate on second spindles that are connected to the support along the second axis;
   an electromagnetic drive, which is coupled to cause the micromirrors and the support to rotate respectively about the first and second axes; and
   one or more flexible belts, which comprise thin strips separated by grooves etched through the substrate from the support on one side of the strips and from the micromirrors on the other side of the strips, and which are connected to the micromirrors so as to synchronize an oscillation of the micromirrors about the respective first axes.

9. The apparatus according to claim 8, wherein the electromagnetic drive comprises:
   a stator assembly, comprising at least one magnetic core having an air gap and at least one coil wound on the magnetic core; and
   at least one rotor, on which the support is mounted and which is suspended in the air gap so as to move withinthe air gap in response to a current driven through the at least one coil.

10. The apparatus according to claim 9, wherein the support has a pair of wings, each connected to the substrate by a respective spindle, and wherein the at least one rotor comprises a pair of permanent magnets, each connected to a respective one of the wings.

11. The apparatus according to claim 9, wherein the electromagnetic drive and the current are configured to cause the micromirrors to rotate about the first axes at a first frequency, which is a resonant frequency of rotation, while causing the support to rotate about the second axis at a second frequency, which is lower than the first frequency.

12. The apparatus according to claim 8, and comprising:
a transmitter, which is configured to emit a beam comprising pulses of light toward the micromirror array while the micromirrors and the support rotate, so as to cause the micromirrors to scan the beam over a scene;
a receiver, which is configured to receive, by reflection from the micromirror array, the light reflected from the scene and to generate an output indicative of a time of flight of the pulses to and from points in the scene; and
a controller, which is coupled to process the output of the receiver during a scan of the beam so as to generate a three-dimensional map of the scene.

13. A method for producing an optical scanning device, the method comprising etching a substrate so as to define:
an array of two or more parallel micromirrors, comprising at least first and second micromirrors;
a gimbal, closely surrounding the entire array of micromirrors;
respective first spindles connecting the micromirrors to the support, thereby defining respective first parallel axes of rotation of the micromirrors relative to the gimbal, and second spindles connecting the gimbal to the substrate and defining a second axis of rotation, perpendicular to the first axes, such that the second spindles are parallel to the second axis; and one or more flexible belts, which comprise thin strips separated by grooves etched through the substrate from the gimbal on one side of the strips and from the micromirrors on the other side of the strips, and which have a first end attached to a first edge of the first micromirror and a second end attached to a second edge of the second micromirror and are anchored to the gimbal at a point between the first and second ends so as to mechanically synchronize an angular orientation of oscillation of the micromirrors about the respective first axes, while the gimbal rotates about the second axis relative to the substrate in order to maintain phase locking.

14. The method according to claim 13, wherein the substrate is a part of a silicon wafer.

15. A method for scanning, comprising:
providing a substrate, which is etched to define an array of two or more parallel micromirrors, a support closely surrounding the array, respective first spindles connecting the micromirrors to the support along respective, parallel first axes, second spindles connecting the support to the substrate along a second axis, perpendicular to the first axes;
driving the micromirrors to rotate in mutual synchronization of angular orientation about the respective parallel first axes of rotation relative to the support while driving the support to rotate about the second axis relative to the substrate; and directing a beam of light toward the micromirror array while the micromirrors and the support rotate, so as to cause the micromirrors to scan the beam over a scene; and
connecting one or more flexible belts, which comprise thin strips separated by grooves etched through the substrate from the support on one side of the strips and from the micromirrors on the other side of the strips, to the micromirrors so as to synchronize an oscillation of the micromirrors about the respective first axes.

16. The method according to claim 15, wherein directing the beam comprises directing pulses of the light toward the micromirror array, and wherein the method comprises:
receiving, by reflection from the micromirror array, the light reflected from the scene;
generating an output indicative of a time of flight of the pulses to and from points in the scene; and
processing the output during a scan of the beam so as to generate a three-dimensional map of the scene.

17. The method according to claim 15, wherein driving the mirrors comprises applying a current to an electromagnetic drive, which is coupled to the micromirror array, so as to cause the micromirrors to rotate about the first axes at a first frequency, which is a resonant frequency of rotation, while causing the support to rotate about the second axis at a second frequency, which is lower than the first frequency.

* * * * *